(12) United States Patent
Levermore et al.

(10) Patent No.: US 8,907,560 B2
(45) Date of Patent: Dec. 9, 2014

(54) DYNAMIC OLED LIGHTING

(75) Inventors: Peter Levermore, Ewing, NJ (US);
Kamala Rajan, Ewing, NJ (US);
Prashant Mandlik, Ewing, NJ (US);
Emory Krall, Ewing, NJ (US); Huiqing Pang, Ewing, NJ (US); Ruiqing Ma, Ewing, NJ (US)

(73) Assignee: Universal Display Corporation, Ewing, NJ (US)

(*) Notice: Subject to any disclaimer, the term of this patent is extended or adjusted under 35 U.S.C. 154(b) by 615 days.

(21) Appl. No.: 13/106,660

(22) Filed: May 12, 2011

(65) Prior Publication Data
US 2012/0286245 A1  Nov. 15, 2012

(51) Int. Cl.
*H01L 51/52* (2006.01)
*H01L 51/00* (2006.01)

(52) U.S. Cl.
CPC ..... *H01L 51/0097* (2013.01); *H01L 2251/5338* (2013.01); *Y02E 10/549* (2013.01)
USPC ............... 313/511; 257/40; 257/99; 257/100; 257/E51.018

(58) Field of Classification Search
USPC ............... 313/511; 257/40, 99, 100, E21.018
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,771,021 B2 | 8/2004 | Cok | |
| 7,049,757 B2 | 5/2006 | Foust et al. | |
| 7,075,226 B2 | 7/2006 | Cok | |
| 7,279,704 B2 | 10/2007 | Walters et al. | |
| 7,431,968 B1 | 10/2008 | Shtein et al. | |
| 2003/0230980 A1 | 12/2003 | Forrest et al. | |

(Continued)

FOREIGN PATENT DOCUMENTS

WO    WO 2010090519 A2 * 8/2010

OTHER PUBLICATIONS

Oled-Info.com; "Novaled shows a new "Jumping Flash" transparent OLED lamp design" http://www.oled-info.com/novaled-shows-new-jumping-flash-transparent-oled-lamp-design Jan. 11, 2011.

(Continued)

*Primary Examiner* — Michael Jung
*Assistant Examiner* — John P Dulka
(74) *Attorney, Agent, or Firm* — Duane Morris LLP

(57) ABSTRACT

A flexible OLED is provided on a flexible substrate. The flexible substrate has at least cut region. The substrate is expandable due to the separation of the flexible substrate at the cut region that is accommodated by bending of the flexible substrate. The substrate on which the flexible OLED is deposited on may be expanded without plastic deformation.

45 Claims, 5 Drawing Sheets

(56) References Cited

U.S. PATENT DOCUMENTS

| | | |
|---|---|---|
| 2004/0174116 A1 | 9/2004 | Lu et al. |
| 2006/0232194 A1 | 10/2006 | Tung |
| 2008/0018244 A1* | 1/2008 | Anandan .................. 313/511 |
| 2008/0237181 A1* | 10/2008 | Wagner et al. ............... 216/13 |
| 2010/0295032 A1 | 11/2010 | Kwong et al. |
| 2011/0057559 A1 | 3/2011 | Xia et al. |
| 2011/0163683 A1* | 7/2011 | Steele et al. .............. 315/192 |
| 2012/0157804 A1* | 6/2012 | Rogers et al. ............. 600/345 |
| 2012/0330386 A1* | 12/2012 | McNeill ..................... 607/90 |

OTHER PUBLICATIONS

Bickley, W.G, "The Heavy Elastica," *The London, Edinburgh, and Dublin Philosophical Magazine and Journal of Science*, vol. XVII, 7$^{th}$ Series, Taylor and Francis (London, England), pp. 603-622, Jan.-Jun. 1934.

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 3, 4-6 (1999).

Tucker et al. "Strain Deconcentration in Thin Films Patterned with Circular Holes" Int. 1. Appl. Mech. 1,557 (2009).

Rogers et al. "Optical evaluation of the flexural rigidity and residual stress in thin membranes: Picosecond transient grating measurements of the dispersion of the lowest-order Lamb acoustic waveguide mode" J. Mater. Res., vol. 16, No. 1, Jan 2001, pp. 217-225.

NASA Technical Note D-3270: Techniques for the Measurement of the Flexural Rigidity of Thin Films and Laminates, H. L. Price, Apr. 1966.

BS 3356:1990, British Standard Method for Determination of Bending Length and Flexural Rigidity of Fabrics, British Standards Institution © 1999.

* cited by examiner (a)

(b)

(c)

DYNAMIC OLED LIGHTING

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to OLED lighting, in particular to flexible OLED lighting.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

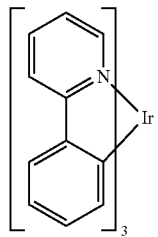

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A first device is provided, comprising a flexible substrate, having at least one flexible OLED device deposited on the flexible substrate, wherein the flexible substrate has at least one cut region, and wherein the flexible substrate is expandable due to separation of the flexible substrate at the at least one cut region that is accommodated by bending of the flexible substrate.

In one aspect, the first device is expandable with minimal local strain in the plane of the first device within the active area of the OLED device.

In one aspect, the first device has a first configuration that is planar, and a second configuration that is non-planar, wherein at least one pair of points on the first device have greater separation in the non-planar configuration than in the planar configuration. In another aspect, the first device is reversibly expandable.

In one aspect, the flexible substrate is expandable with minimal plastic deformation within the active area of the OLED device.

In one aspect, the first device has a first configuration that is a developable surface and a second configuration that is expanded relative to the first configuration along a line that lies in the developable surface, wherein the second configuration has a non-planar three dimensional geometry, and wherein the first device may reversibly adopt the first and second configurations with minimal plastic deformation within the active area of the OLED device. In another aspect, the developable surface is a flat plane and the line is a straight line.

In another aspect, the first device further comprises at least one structurally weakened region that includes at least one of a scored region, a perforated region, or a folded region. In one aspect, the at least one cut region is formed prior to deposition of the OLED. In one aspect, the at least one structurally weakened region is formed prior to deposition of the OLED. In one aspect, no complete OLED is deposited on the at least one structurally weakened region. In one aspect, at least one portion of the surface of the flexible substrate can deform out of plane due to the at least one cut region. In one aspect, at least one portion of the surface of the flexible substrate can deform out of plane due to the at least one structurally weakened region.

In one aspect, the flexible substrate comprises metal foil, plastic, fabric, paper or combinations thereof. In another aspect, the metal foil comprises stainless steel foil, aluminum foil, copper foil or combinations thereof. In one aspect, the metal foil has a thickness of about 5 microns to about 300 microns. In one aspect, the plastic comprises polyethylene terephthalate, polyethylene naphthalate, or combinations thereof. In one aspect, the plastic has a thickness of about 5 microns to about 5000 microns. In one aspect, the flexible substrate has a flexural rigidity from about $10^{-6}$ Nm to about 1.0 Nm. In one aspect, the flexible substrate has a flexural rigidity from about $10^{-5}$ Nm to about 0.1 Nm.

In one aspect, the first device is a lamp. In another aspect, the OLED conforms to the shape of the flexible substrate.

In one aspect, the OLED is in direct contact with the flexible substrate. In another aspect, at least one layer is present between the OLED and the surface of the flexible substrate. In another aspect, the flexible substrate further comprises a layer of insulating material deposited between the surface of the flexible substrate and the OLED. In one aspect, the insulating material comprises a polyimide layer. In one aspect, the insulating material comprises an inorganic dielectric layer. In another aspect, the insulating material has a thickness of about 2 microns to about 20 microns.

In one aspect, the OLED device comprises a single pixel. In another aspect, the OLED device comprises a plurality of pixels. In another aspect, the plurality of pixels are connected in series. In another aspect, the plurality of pixels are connected in parallel. In one aspect, the OLED device has an active area and the active area comprises at least 30% of the surface area of the flexible substrate.

In one aspect, the OLED device is covered with a thin film encapsulation layer. In one aspect, the structurally weakened region is substantially free of the thin film encapsulation layer. In one aspect, the thin film encapsulation layer has a thickness of less than 10 microns. In another aspect, a hard coat layer is present on top of the thin film encapsulation layer.

In one aspect, the first device is attached to at least one contact region. In one aspect, the first device is attached to a contact region. In one aspect, the first device is expandable by a mechanical means. In another aspect, the mechanical means comprises a motor operably attached to a proximity sensor. In one aspect, the flexible substrate is reversibly expandable in at least one direction to a length at least 10% greater than the initial length of the flexible substrate in the given direction. In one aspect, the flexible substrate is reversibly expandable in at least one direction to a length at least 20% greater than the initial length of the flexible substrate in the given direction. In one aspect, the flexible substrate is reversibly expandable in at least one direction to a length at least 50% greater than the initial length of the flexible substrate in the given direction.

In one aspect, one or more edges of the first device comprise a protective coating. In one aspect, the first device contains no transistors.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
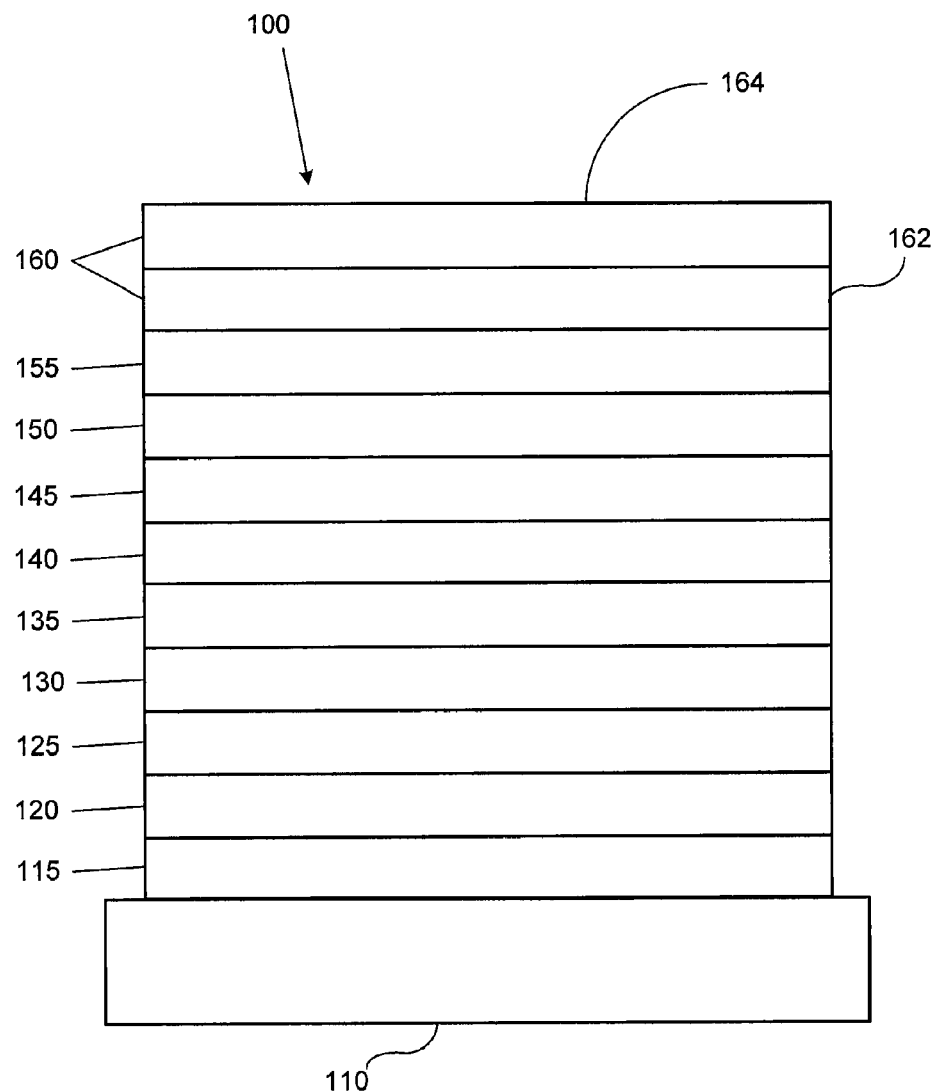
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
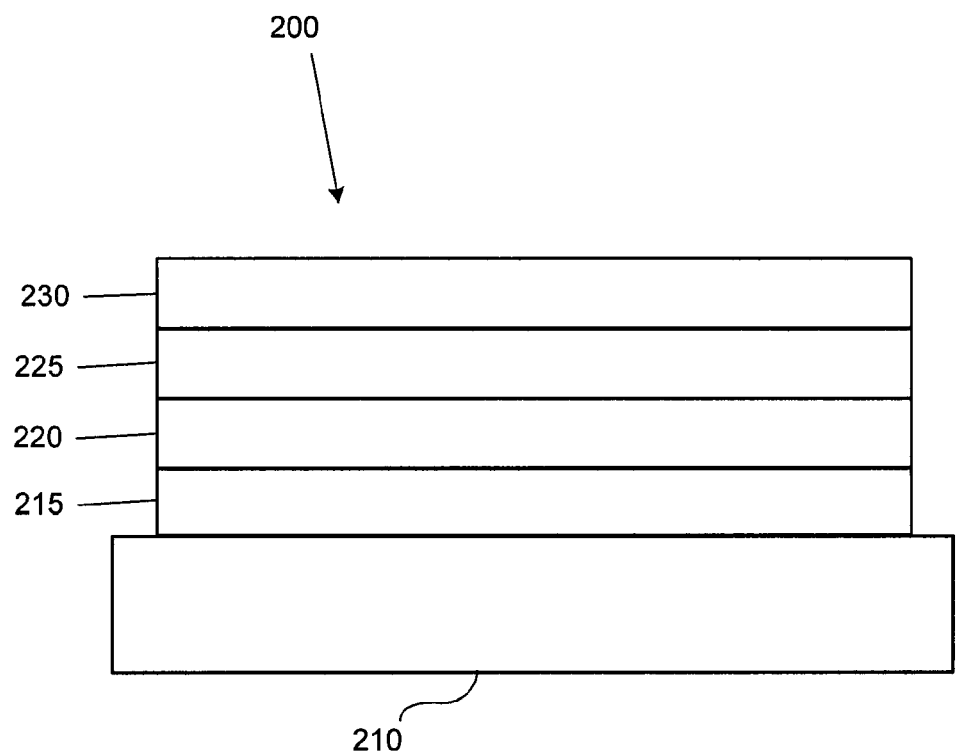
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used.

Although many of the examples provided herein describe various layers as comprising a single material, it is understood that combinations of materials, such as a mixture of host and dopant, or more generally a mixture, may be used. Also, the layers may have various sub-layers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

A device is provided, comprising a flexible substrate, having at least one flexible OLED device deposited on the flexible substrate, wherein the flexible substrate has at least one cut region, and wherein the flexible substrate is expandable due to separation of the flexible substrate at the cut region that is accommodated by bending of the flexible substrate.

By "expandable" it is meant that, for at least two points on the substrate, the length of the shortest line or curve that runs between two points along the substrate can be increased. For a planar surface, this is a straight line between the points. For a developable surface, this is generally a straight line between the points when the surface is flattened in a developable manner, and is generally a curved line between the points when the surface is curved in a developable manner. Because the substrate itself, at least where OLEDs are present, generally does not expand because such expansion may damage the OLED, this increase in length is caused by separation of the substrate at a cut.

In one embodiment, the device has a first configuration that is a developable surface and a second configuration that is expanded relative to the first configuration along a line that lies in the developable surface, wherein the second configuration has a non-planar three dimensional geometry, and wherein the device may reversibly adopt the first and second configurations with minimal plastic deformation within the active area of the OLED device. The line can be a curved line, and the length of the line can increase even if the end points of the line do not move apart. This is due to the presence of the at least one cut region. Preferably, the developable surface is a flat plane and the line is a straight line.

Figure 3:
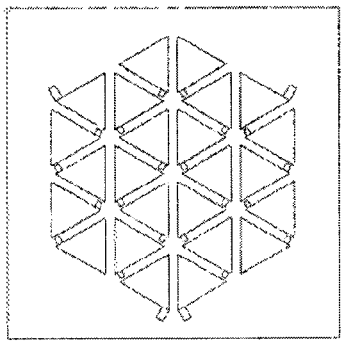
FIG. 3 shows (a) an anode pattern, (b) cathode pattern, and (c) anode and cathode patterns superimposed with cutting marks.
Figure 3:
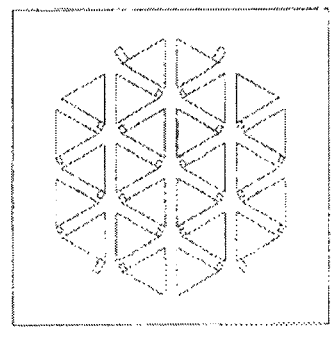
Figure 3:
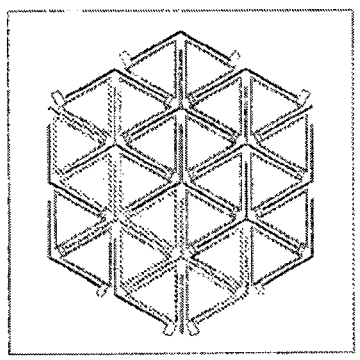

In one embodiment, the flexible substrate has a first configuration that is flat and planar, and a second configuration that is non-planar, wherein at least one pair of points on the first device have greater separation in the non-planar configuration than in the planar configuration. In one embodiment, the first device is reversibly expandable. In one embodiment, the device is as depicted in FIG. 3.

In one embodiment, the first device further comprises at least one structurally weakened region that includes at least one of a scored region, perforated region, or folded region. The term "structurally weakened region" also includes cut regions. In one embodiment, the flexible substrate comprises a plurality of structurally weakened regions that are a combination of cut, scored, perforated or folded regions. Including scored, perforated, or folded regions can control the way the substrate moves, and may be advantageous depending on the desired use of the first device. Scored, perforated, or folded regions do not contribute to the expansion of the first device. Structurally weakened regions may be made using art-recognized cutting procedures capable of working with the materials disclosed herein. Exemplary cutting procedures include, but are not limited to, wet chemical etching, plasma etching, laser cutting, and mechanical cutting.

A cut region is a portion of the surface of the flexible substrate where a cutting procedure has penetrated both the top and bottom surfaces of the flexible substrate. In a preferred embodiment, the cut lines have rounded ends, to minimize the risk of tearing the substrate upon formation of the three dimensional configuration. In a preferred embodiment, there are circular holes at the ends of each cut. In a scored region, on the other hand, a cutting procedure has penetrated only partly through the top (or bottom) surface of the flexible substrate. Preferably, the score is made on the side of the flexible substrate that is not used for OLED deposition, which allows bus lines or electrical interconnects to pass over the scored regions.

A perforated region is a portion of the surface of the flexible substrate that has alternating cut and uncut regions, or alternating scored and un-scored regions, or combinations thereof. A folded region is a region where the flexible substrate has been folded to form a fold line. In one embodiment, no complete OLED is deposited on a structurally weakened region. Depositing a complete OLED on a structurally weakened region can result in delamination and short circuit or open circuit failure when the first device adopts a shape in the second configuration. In one embodiment, at least one cut region is formed prior to OLED deposition. In one embodiment, at least one structurally weakened region is formed prior to OLED deposition. Creating the structurally weakened region prior to OLED deposition is preferred because the risk of damaging the OLED stack is reduced. In one embodiment, the device is folded along at least one structurally weakened region, which may be a cut, scored, or perforated region.

In one embodiment, the first device is expandable with minimal local strain in the plane of the first device within the active area of the OLED device. In one embodiment, the device is expandable with minimal plastic deformation within the active area of the OLED device.

By "with minimal local strain" it is meant that any particular discrete portion or section of the device within the active area of the OLED device on a micro-scale is subject to the strain experienced by a typical flexible OLED. Cut regions in one embodiment of the device allow for out-of-plane deformation of the flexible substrate. Thus the expansion of the flexible substrate is due to separation of portions of the substrate because of the cut regions; the flexible substrate does not itself expand beyond what is typical for a flexible OLED made of a specific material (e.g. typical expansion appropriate for metal foil, plastic, etc.) The structurally weakened regions, including the cut regions, made in the flexible substrate assimilate and concentrate the strain away from the active portions of the flexible substrate that have OLEDs deposited thereon. Out-of-plane deformation then dissipates the strain, reducing strain in the structurally weakened regions and the rest of the device considerably.

By "with minimal plastic deformation" it is meant that there may be plastic deformation around the structurally weakened regions, but this plastic deformation should not extend within the active area of the OLED device. Within the active area of the device, there may still exist some minimal strain that results in elastic deformation of the device. This elastic deformation is intended to be reversible and should not affect the performance of the OLED device. Similarly, there is minimal local shear strain on a micro-scale on any particular discrete portion or section of the device within the active area of the OLED device. This minimal local shear strain is insufficient to result in plastic deformation of the device within the active area of the OLED device. The surface area of the flexible substrate that experiences plastic deformation around the structurally weakened regions is expected to be substantially less than the surface area of the flexible substrate where plastic deformation is minimal. The majority of the flexible substrate is expected to remain substantially in the elastic regime. This allows the flexible substrate to be reversibly expandable, even in the circumstance of plastic deformation in the structurally weakened regions.

The term "with minimal local strain" is intended to include instances where unwanted failure may occur after many repeated cycles of movement, as often occurs in mechanical devices. The term "with minimal local strain" is intended to exclude structures where noticeable plastic deformation in the plane of the substrate occurs within the active area of the OLED device in a single movement or within intended movement parameters. The term "with minimal local strain" is intended to include balanced expansion and compression about a neutral plane as is commonly understood to occur when a thin planar structure is deformed into a developable surface.

By "no complete OLED is deposited on a structurally weakened region" it is meant that the emissive area of the OLED and any surrounding area of the OLED needed for device operation is not deposited in or on the structurally weakened region. This may generally correspond to no component organic materials of the organic layers being deposited in or on the structurally weakened region, but some overlap may be permissible. Overspray of extra organic or other material not used with the OLED is permissible. In certain embodiments it is acceptable for bus lines or electrical interconnects to pass over or through a structurally weakened region. Depositing OLED on a structurally weakened region could result in short circuits when the device is expanded into a non-planar configuration. This is especially important when the structurally weakened region is formed after deposition of the thin film encapsulation layer.

Preferably, the at least one structurally weakened region, whether cut, scored, perforated, or folded is made prior to OLED deposition. This helps to avoid potential damage to the OLED stack. After cutting, scoring, perforation, or folding, the flexible substrate may be expanded. FIG. 3(c) shows cut marks on a flexible substrate to obtain, in one embodiment, a hexagonal fish-scale device. In a preferred embodiment, where there are cut regions, the ends of the cut marks are rounded, rather than square. In a preferred embodiment, the rounded ends comprise circular holes in the substrate at each end of the cut. This reduces the risk of tearing the flexible substrate during repeated expansion and contraction.

In one embodiment, at least one portion of the surface of the flexible substrate can deform out of plane due to the structurally weakened regions. For example, in one embodiment a stretching force can be applied to opposite ends of a device comprising a plurality of cut regions, and as the flexible substrate of the device is stretched, portions of the substrate are able to move out of the plane of the stretching force.

A flexible and expandable OLED light panel is fabricated on a flexible substrate, where cuts, scores or perforations are made into the substrate to increase flexibility and expandability. The flexible substrate can be made of any flexible material. In one embodiment, the flexible substrate comprises metal foil, plastic, fabric, paper or combinations thereof. In another embodiment, the metal foil comprises stainless steel foil, aluminum foil, copper foil or combinations thereof. In one embodiment, the metal foil has a thickness of about 5 microns to about 300 microns. In one embodiment, the plastic comprises polyethylene terephthalate, polyethylene naphthalate, or combinations thereof. In another embodiment, the plastic has a thickness of about 5 microns to about 5000 microns. The exact thickness requirements depend on the substrate processing, lamination, device layers etc., and are readily ascertainable by one of skill in the art. In one embodiment, the flexible substrate has a flexural rigidity from about $10^{-6}$ to about 1.0 Nm. In one embodiment, the flexible substrate has a flexural rigidity from about $10^{-5}$ to about 0.1 Nm.

In one embodiment, the first device is a lamp. In another embodiment, the OLED conforms to the shape of the first device. By "conforms" it is meant that the OLED adapts to any change in the curvature of the flexible substrate if the shape of the first device is changed.

Figure 5:
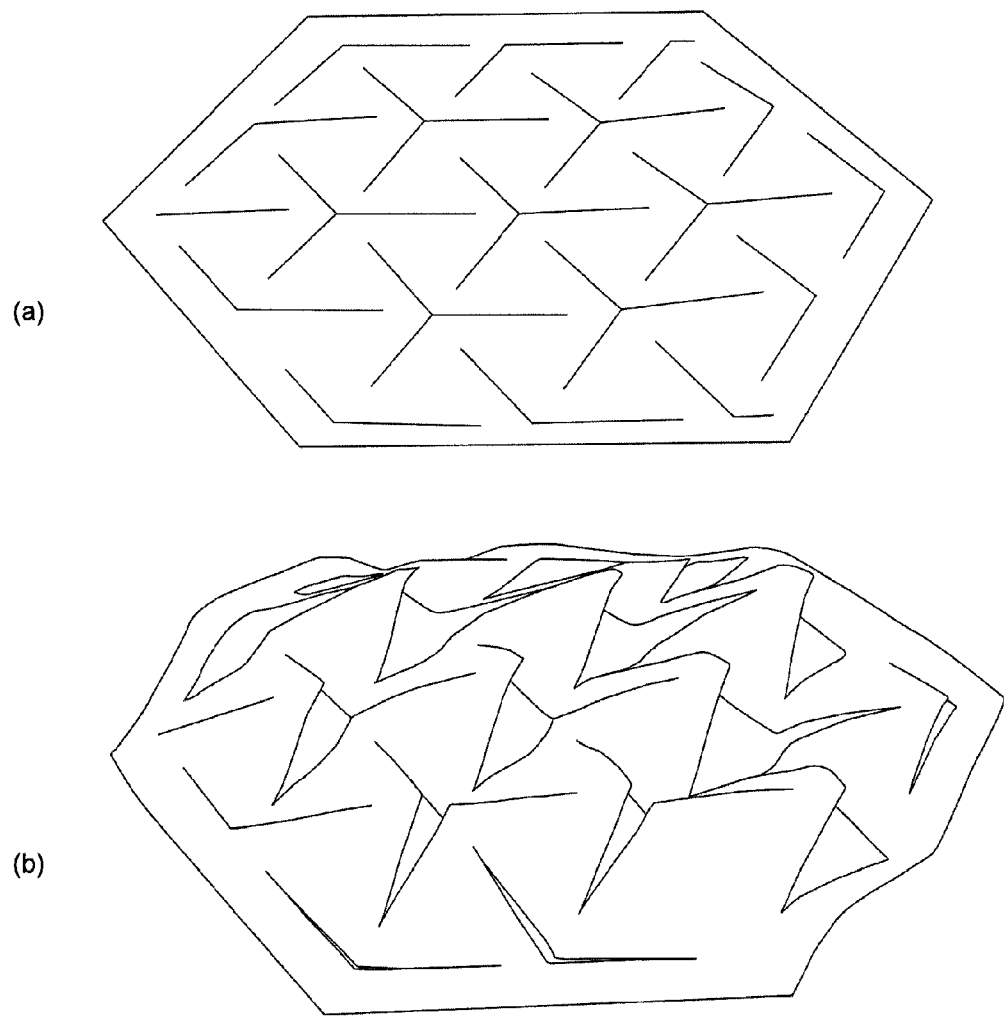
FIG. 5 shows a hexagonal fish-scale device in (a) a flat orientation, and (b) in an expanded configuration.

FIG. 5 shows an example where tri-branched cuts have been made into a hexagonal stainless steel foil substrate with a thickness of 25 μm. FIG. 5(a) shows the substrate in a flat planar configuration, while FIG. 5(b) shows the substrate in an expanded configuration. The tri-branch cuts allow the substrate to deform out of the plane, which enables extra flexibility and expandability. This behavior is extremely desirable for applications, such as putting OLEDs on fabrics for clothing. Additionally, areas of the substrate deflect away from the plane. This allows for the direction of illumination to be controlled.

Flexible metal and plastic substrates often suffer from higher asperity count and high root mean square (RMS) surface roughness. Various planarization methods can be used, such as deposition of a resist (e.g. polyimide), followed by a hard bake, or alternatively deposition of an inorganic dielectric using methods such as PECVD. In one embodiment, the first device further comprises an insulating material deposited between the surface of the flexible substrate and the OLED. In one embodiment, the insulating material comprises a polyimide layer. In another embodiment, the insulating material comprises an inorganic dielectric. The planarization layer may remove electrical contact between the OLED and the substrate. This is particularly important in the case of metal foils, where in some circumstances it may be advantageous not to have electrical current flowing through the substrate. The planarization layer may also act as a permeation barrier, which is particularly important in the case of plastic substrates, where oxygen and moisture can permeate through the substrate. In one embodiment, the insulating material has a thickness of about 2 microns to about 20 microns.

With respect to OLED deposition, the anode and/or bus lines could be deposited by vacuum thermal evaporation or sputtering through a shadow mask, or blanket deposited and then patterned using photolithography. Examples of anode materials include, but are not limited to, IZO, ITO, Al, Ag or combinations thereof. Individual anode areas are preferably patterned in the substrate areas between structurally weakened regions. In one embodiment, the OLED is in direct contact with the surface of the flexible substrate. In one embodiment, the OLED comprises a single pixel. In some embodiments, a single large area pixel could be used. In another embodiment, the OLED comprises a plurality of pixels. In one embodiment, the plurality of pixels are connected in series. In another embodiment, the plurality of pixels are connected in parallel.

In some embodiments, individual pixels are connected in parallel using bus lines, whereas in other embodiments individual pixels are connected in series, where the cathode of one pixel is in electrical contact with the anode of an adjacent pixel. In some embodiments, the individual pixels are connected by a combination of parallel and series connections. Where the individual pixels are connected in parallel, they may be connected using high conductivity bus lines. Examples of bus line materials include, but are not limited to, Al, Ag, Au, Cu. Bus lines or electrical interconnects may pass over score marks made on the reverse of the substrate, over fold lines, or through gaps between structurally weakened regions.

Figure 4:
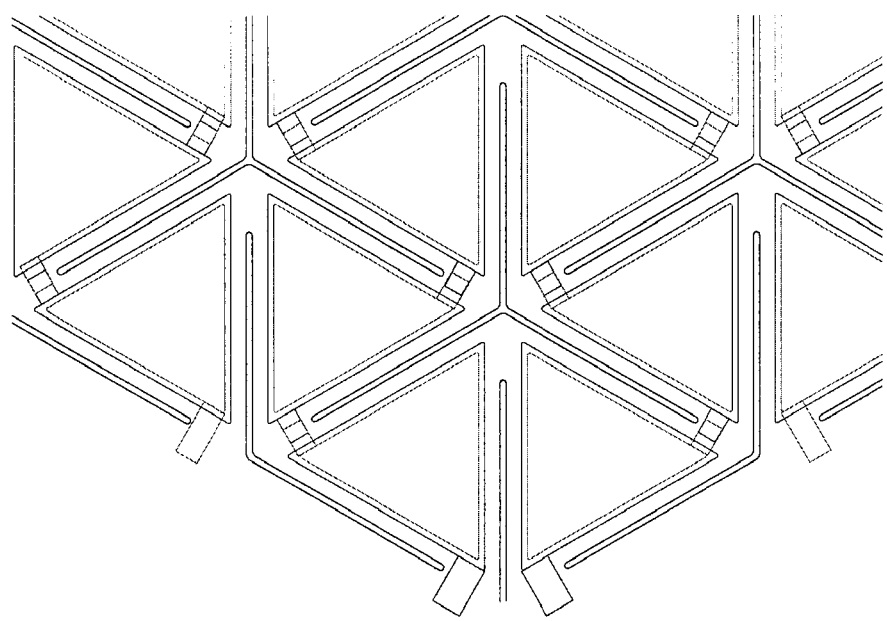
FIG. 4 shows a close up view of a portion of FIG. 3.

In one embodiment, the anode pixel layout is shown in FIG. 3(a). In this embodiment, the first device comprises 24 triangular OLED pixels separated by structurally weakened cut regions in a hexagonal pattern. The OLED pixels are connected in 4 series strings, where 2 of the series strings consist of 5 OLED pixels, and 2 of the series strings consist of 7 OLED pixels. Within the series strings, the cathode from the first pixel contacts the anode of the second pixel and so on. This is shown in FIG. 4. Advantages of series connections are well described in the art (e.g. U.S. Pat. No. 7,049,757 B2). These advantages include low current that is independent of the number of pixels, and a tolerance to electrical shorting, such that if one pixel shorts, other pixels will continue to operate. One disadvantage of series connection is high voltage, which increases linearly with the number of pixels. In this example, the required voltage is either 5 times or 7 times that required for a single pixel.

In FIG. 3(a) and FIG. 3(b) anode and cathode contact pads can be seen. These are the small square pads that extend beyond the hexagon pattern. The contact pads are used to make electrical contact to the OLED devices. To illuminate all 24 triangular OLED devices, electrical connection must be made to all 4 cathode pads, and all 4 anode pads. Current will then flow between the anode and cathode contacts in each of the 4 strings. In one embodiment micro-wires could be used to make electrical contact to the electrode pads. The micro-wires can run along the rear of the substrate (which is electrically isolated from the OLED device by the insulating layer) toward one a more contact regions. These contact regions could then be used to deliver electrical current to the device. The contact region may be used for mechanical and/or electrical contact. In one embodiment, the first device is attached to at least two contact regions. In one embodiment, force exerted on the first device at the contact regions is used to expand the device.

The anode may comprise 3000 Å Al deposited by vacuum thermal evaporation (VTE) through a shadow mask onto a polyimide planarization layer. In one embodiment, the anode layer is reflective, giving rise to a top-emitting OLED. In one embodiment, the organic layers are disposed onto the substrate by vacuum thermal evaporation through a shadow mask. In one embodiment, the OLED stack comprises 100 Å LG101 as a hole injection layer (HIL) (supplied by LG Chemicals of Korea), 3800 Å NPD as a hole transport layer (HTL), a 200 Å thickness first emissive layer (EML1), a 75 Å thickness second emissive layer (EML2), a 50 Å thickness blocking layer (BL), a 450 Å thickness electron transport layer (ETL) of LG201 (supplied by LG Chemicals of Korea) doped with 65% lithium quinolate (Liq), a 10 Å thickness layer of Liq as an electron injection layer (EIL) and a cathode. In one embodiment, the cathode layer is deposited onto the organic layers through a shadow mask using VTE. In one embodiment, a semi-transparent compound cathode of 120 Å thickness Mg:Ag (10% Ag) can be deposited through the shadow mask design shown in FIG. 3(b).

As shown in FIG. 3(c), all anode and cathode areas should be contained within areas between structurally weakened regions. It is preferred that the organic materials of the organic stack are also contained within areas between structurally weakened regions. Each complete OLED pixel is then contained in an area between structurally weakened regions.

FIG. 4 shows an enlargement of FIG. 3(c). The smaller triangles are the cathodes, the larger triangles are the anode. FIG. 4 also shows the cut marks between OLED pixels. In a preferred embodiment, the cut lines have rounded ends, to minimize the risk of tearing the substrate upon formation of the three dimensional configuration. In a preferred embodiment, the rounded edges comprise circular holes in the substrate at each end of the cut.

In one embodiment, the OLED is covered with a thin film encapsulation (TFE) layer. In one embodiment, the thin film encapsulation layer completely covers the OLED. In one embodiment, a small bridge between adjacent devices, where the anode of one pixel contacts the cathode of an adjacent pixel is uncovered by the thin film encapsulation layer. When this bridge remains exposed, it is possible to select a sub-set of the pixels to illuminate. Only the pixels between the two points where electrical contact is made will illuminate. In one embodiment, the small bridge between adjacent devices is reinforced with a conductive material. This ensures reliable electrical contact and provides mechanical stability. This may be especially desirable where the bridge remains exposed, and where a thin and semi-transparent cathode material is used.

When fabricating an OLED on a flexible substrate, in order to maintain flexibility, the thin film encapsulation layer must also have mechanical flexibility. In one embodiment, the thin film encapsulation layer does not cover the anode or cathode contact pads, as these are needed for making electrical connection to the OLED. In one embodiment, the contact pads are reinforced with a conductive material. This ensures reliable electrical contact and provides mechanical stability.

It is common to use thin film encapsulation layers that are a combination of organic and inorganic materials. The inorganic materials provide an effective barrier against the permeation of moisture and oxygen, while the organic materials provide mechanical flexibility and help to distribute any faults in the inorganic layers, which increase the diffusion path length through the barrier.

In another embodiment, a hard coat layer is present on top of the thin film encapsulation layer. The hard coat layer can provide additional protection to the thin film encapsulation layer and the OLED and/or include scattering layers which improve color uniformity and light extraction. Exemplary materials for the hard coat layer include, but are not limited to, polyimide, polyurethane, and polyacrylate. In one embodiment, the thin film encapsulation layer has a thickness of less than 10 microns. In one embodiment, the at least one structurally weakened region is substantially free of the thin film encapsulation layer. By "substantially free of the thin film encapsulation layer" it is meant that the footprint of the thin film encapsulation layer does not extend past the structurally weakened regions within the limits of precision of the thin film deposition technique, for example, PECVD. This is especially important, where the structurally weakened region is formed after deposition of the thin film encapsulation layer.

In one embodiment, the OLED device has an active area and the active area comprises at least 30% of the surface area of the flexible substrate. This amount of OLED coverage allows for sufficient light output for a variety of consumer or commercial applications.

The first device as described above, is suited for lighting applications, particularly decorative lighting applications. In one embodiment, the first device contains no transistors, and is not adapted for display purposes.

In one embodiment, the first device is attached to at least one contact region. The contact region can be any external surface or attachment point. The contact region can also be used for mechanical and electrical contact.

In one embodiment, one or more of the edges of the first device comprise a protective coating. The protective coating may smooth the edge of the device if this is required for a particular application. In one embodiment, the protective coating can comprise metal foil, plastic, fabric, flexible glass, paper or combinations thereof. The protective coating should generally closely match the mechanical characteristics of the flexible substrate. In one embodiment, the protective coating is a hard coat layer comprising polyimide, polyurethane or polyacrylate. In one embodiment, the protective coating may be used to make electrical contact to the device.

The flexible substrate may be expanded by physical means (i.e. using hands) or by attachment to a machine that can expand and release the flexible substrate. In one embodiment, the flexible substrate is expandable by a mechanical means. In another embodiment, the mechanical means comprises a motor operably attached to a proximity sensor. A proximity sensor can, for example, activate a machine to stretch and release the flexible substrate when an individual or an object comes within a specified distance of the proximity sensor. Such a set up can be used in both consumer and commercial applications (e.g. a moving OLED light).

In order to form a expandable flexible device that is expandable due to separation of the flexible substrate at cut regions accommodated by bending of the flexible device, the flexible substrate properties and configuration of the cuts should be controlled.

It is well understood that where a flexible substrate is placed under strain in the plane of the substrate, if cuts or holes are made in the substrate, the strain will concentrate around the cuts or holes [see Tucker et al. "Strain Deconcentration in Thin Films Patterned with Circular Holes" Int. J. Appl. Mech. 1, 557 (2009)]. This reduces strain in the remainder of the substrate, which allows for additional expandability relative to a substrate without cuts or holes. In addition, if sections of the substrate are allowed to deflect out of the plane, this further reduces strain, which allows for additional expandability relative to a substrate where sections of the substrate cannot deflect out of the plane. By minimizing strain in sections of the flexible substrate, these sections of the substrate are useful for OLED fabrication.

Although plastic deformation may occur in the flexible substrate around the cuts or holes upon formation of the three dimensional configuration, the remainder of the flexible substrate remains substantially in the elastic regime, and so when strain is removed, the substrate may still draw back to the initial planar configuration.

Although cuts and holes may both be used to deconcentrate strain, a preferred approach is to use one or more cuts. The reason for this is that when using cuts, available substrate surface area for OLED fabrication, where strain is minimal, may be greater than when using holes. This allows for greater light output and improved functionality.

A preferred approach is to make an array of cuts in a flexible substrate. Preferably, the array of cuts are made in more than one direction across a substrate. This allows for expansion of the device in multiple directions. One particularly effective approach is to make an array of tri-branched cuts in a flexible substrate, as shown in FIG. 5. Length and spacing of the tri-branched cuts may be used to control expandability. Other orientations of cuts are also envisaged.

In order to dissipate strain by deflecting out of the plane, the substrate is required to be flexible. However, it may be required that the substrate also have a certain amount of rigidity. One straightforward metric that may be used to measure the balance of flexibility and rigidity is flexural rigidity depending on the application. This is defined as the force couple required to bend a rigid structure to a unit curvature. For a uniform substrate with no cuts or structurally weakened regions, flexural rigidity can be described mathematically as:

$$D=Et^3/12(1-\mu^2) \quad (1)$$

Where D is flexural rigidity (in Nm), E is Young's modulus (in $Nm^{-2}$), $\mu$ is Poisson's ratio and t is the thickness of the substrate (in m). This equation is described in Rogers & Bogart, J. Mater. Res., Vol. 16, No. 1, January 2001. The more flexible the substrate, the lower the flexural rigidity. The flexural rigidity of any substrate can be theoretically calculated if Young's modulus, Poisson's ratio and the thickness of the substrate are known. However, in practice, especially when dealing with thin films, flexural rigidity may be affected by processing details, lamination of additional layers, non-uniformity across the film, etc.

A preferred approach is to measure flexural rigidity. This can be done using the principle of the heavy elastica, as described in W. G. Bickley: The Heavy Elastica, Phil. Mag. Vol. 17 Mar. 1934 p. 603-622. A couple of specific measurement techniques are described in NASA Technical Note D-3270: Techniques for the Measurement of the Flexural Rigidity of Thin Films and Laminates, H. L. Price, April 1966. These are (1) the heart loop method and (2) the cantilever method. The heart loop method is only suitable for very thin films (typically<20 microns) with very low flexural rigidity. The cantilever method is described in detail in BS 3356: 1990, British Standard Method for Determination of Bending Length and Flexural Rigidity of Fabrics, British Standards Institution © 1999. For application described herein, a flexural rigidity for the substrate in the range $10^{-6}$-1.0 Nm is preferred. For example, a 5 micron thicks stainless steel foil is expected to have flexural rigidity≈$10^{-6}$ Nm, while a 300 micron thick stainless steel foil is expected to have flexural rigidity 1.0 Nm It is also required that the flexible substrate should not be brittle. The flexible substrate should not crack, rupture, tear or otherwise fail so as to affect device operation under strain that is expected for the envisaged application. For example, ceramic substrates or glass substrates are unsuitable for applications described herein. Strain at which a flexible substrate fails is defined as ultimate tensile strain (UTS), where UTS= ($\Delta$L)/L, where L is initial length of the flexible substrate and $\Delta$L is the additional length of the flexible substrate when it fails. UTS of a flexible substrate material, measured on a uniform flexible substrate, where there are no cuts or structurally weakened regions, should be greater than 5%, greater than 10%, greater than 20%, or greater than 50%. As an example, ultimate tensile strain is approximately 60% for a typical steel foil. In one embodiment, the flexible substrate is reversibly expandable in at least one direction to a length at least 10% greater than the initial length of the flexible substrate in the given direction. In one embodiment, the flexible substrate is reversibly expandable in at least one direction to a length at least 20% greater than the initial length of the flexible substrate in the given direction. In one embodiment, the flexible substrate is reversibly expandable in at least one direction to a length at least 50% greater than the initial length of the flexible substrate in the given direction.

Where cuts are made in a flexible substrate to concentrate strain, and where the flexible substrate may deflect out of the plane to then dissipate strain, a flexible substrate may withstand considerably higher strain than otherwise expected. For example, a steel foil substrate expanded by 20% along a plane would experience 20% strain throughout the substrate. However, if there are cuts in the same substrate and the substrate may deflect out of the plane, strain experienced in the substrate is typically less than 5% in the regions adjacent to the cuts, and negligible elsewhere on the substrate. This strain lies comfortably within the UTS of many flexible substrate materials, such as metal or plastic foils. Suitable substrate materials may be ductile and experience some plastic deformation around structurally weakened regions at this low strain (e.g. steel foil plastically deforms at strain as low as 0.2%). However, these materials are not expected to crack, rupture, tear or otherwise fail so as to affect device operation. There may be failure on a micro-scale around defects, such as missing grains, sharp corners etc., but this failure can be distinguished from macro-scale failure that critically affects device performance.

Combination with Other Materials

The materials described herein as useful for a particular layer in an organic light emitting device may be used in combination with a wide variety of other materials present in the device. These other materials are disclosed in U.S. Patent Publication Nos. 2010/0295032 and 2011/0057559, which are incorporated herein by reference.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A first device comprising:
a flexible substrate having a length in a given direction and an outer perimeter;
at least one flexible OLED device deposited on the flexible substrate;
wherein the flexible substrate has at least one cut region;
wherein the at least one cut region does not bisect the outer perimeter and is not connected to the outer perimeter through another cut region;
wherein the flexible substrate is expandable due to separation of the flexible substrate at the at least one cut region that is accommodated by bending of the flexible substrate;
wherein at least one portion of the flexible substrate deforms out of plane due to the at least one cut region when a stretching force is applied to opposite ends of the first device in the given direction; and
wherein the length of the flexible substrate in the given direction increases.

2. The first device of claim 1, wherein the flexible substrate is expandable with minimal local strain in the plane of the first device within the active area of the OLED device.

3. The first device of claim 1, wherein the flexible substrate is expandable with minimal plastic deformation within the active area of the OLED device.

4. The first device of claim 1, wherein the first device has a first configuration that is planar, and a second configuration that is non-planar, wherein at least one pair of points on the first device have greater separation in the non-planar configuration than in the planar configuration.

5. The first device of claim 1, wherein: the first device has a first configuration that is a developable surface;
wherein the first device has a second configuration that is expanded relative to the first configuration along a line that lies in the developable surface;
wherein the second configuration has a non-planar three dimensional geometry;
wherein the first device may reversibly adopt the first and second configurations with minimal plastic deformation within the active area of the OLED device.

6. The first device of claim 5, wherein the developable surface is a flat plane and the line is a straight line.

7. The first device of claim 1, wherein the first device further comprises at least one structurally weakened region that includes at least one of a scored region, perforated region, or folded region.

8. The first device of claim 7, wherein:
the OLED device is covered with a thin film encapsulation layer; and
the at least one structurally weakened region is substantially free of the thin film encapsulation layer.

9. The first device of claim 1, wherein the flexible substrate comprises metal foil, plastic, fabric, paper or combinations thereof 10. The first device of claim 9, wherein the metal foil comprises stainless steel foil, aluminum foil, copper foil or combinations thereof 11. The first device of claim 10, wherein the metal foil has a thickness of about 5 microns to about 300 microns.

12. The first device of claim 9, wherein the plastic comprises polyethylene terephthalate, polyethylene naphthalate, or combinations thereof.

13. The first device of claim 9, wherein the plastic has a thickness of about 5 microns to about 5000 microns.

14. The first device of claim 9, wherein the flexible substrate has a flexural rigidity from about $10^{-6}$ Nm to about 1.0 Nm.

15. The first device of claim 9, wherein the flexible substrate has a flexural rigidity from about $10^{-5}$ Nm to about 0.1 Nm.

16. The first device of claim 1, wherein the first device is a lamp.

17. The first device of claim 1, wherein the OLED conforms to the shape of the first device.

18. The first device of claim 1, wherein the OLED is in direct contact with the surface of the flexible substrate.

19. The first device of claim 1, wherein at least one layer is present between the OLED and the surface of the flexible substrate.

20. The first device of claim 1, wherein the flexible substrate further comprises a layer of insulating material deposited between the surface of the flexible substrate and the OLED.

21. The first device of claim 20, wherein the insulating material comprises a polyimide layer.

22. The first device of claim 20, wherein the insulating material comprises an inorganic dielectric layer.

23. The first device of claim 20, wherein the insulating material has a thickness of about 2 microns to about 20 microns.

24. The first device of claim 1, wherein the OLED device comprises a single pixel.

25. The first device of claim 1, wherein the OLED device comprises a plurality of pixels.

26. The first device of claim 25, wherein the plurality of pixels are connected in series.

27. The first device of claim 25, wherein the plurality of pixels are connected in parallel.

28. The first device of claim 1, wherein at least one portion of the surface of the flexible substrate can deform out of plane due to the at least one cut region.

29. The first device of claim 1, wherein at least one portion of the surface of the flexible substrate can deform out of plane due to at least one structurally weakened region.

30. The first device of claim 1, wherein the OLED device is covered with a thin film encapsulation layer.

31. The first device of claim 30, wherein the thin film encapsulation layer has a thickness of less than 10 microns.

32. The first device of claim 30, wherein a hard coat layer is present on top of the thin film encapsulation layer.

33. The first device of claim 1, Wherein the at least one cut region is formed prior to OLED deposition.

34. The first device of claim 1, wherein the OLED device has an active area and the active area comprises at least 30% of the surface area of the flexible substrate.

35. The first device of claim 1, wherein no complete OLED is deposited on a structurally weakened region.

36. The first device of claim 1, wherein at least one structurally weakened region is formed prior to OLED deposition.

37. The first device of claim 1, wherein the flexible substrate is reversibly expandable in the given direction such that the length of the flexible substrate in the given direction increases by at least 10%.

38. The first device of claim 1, wherein the flexible substrate is reversibly expandable in the given direction such that the length of the flexible substrate in the given direction increases by at least 20%.

39. The first device of claim 1, wherein the flexible substrate is-reversibly expandable in the given direction such that the length of the flexible substrate in the given direction increases by at least 50%.

40. The first device of claim 1, wherein the first device is attached to at least one contact region.

41. The first device of claim 1, wherein the first device is expandable by a mechanical means.

42. The first device of claim 41, wherein the mechanical means comprises a motor operably attached to a proximity sensor.

43. The first device of claim 1, wherein the first device is reversibly expandable.

44. The first device of claim 1, wherein one or more of the edges of the first device comprise a protective coating.

45. The first device of claim 1, wherein the first device contains no transistors.

* * * * *